United States Patent [19]
Delgado et al.

[11] Patent Number: 5,391,513
[45] Date of Patent: Feb. 21, 1995

[54] WET/DRY ANTI-FUSE VIA ETCH

[75] Inventors: Miguel A. Delgado; Stacy W. Hall, both of San Antonio, Tex.

[73] Assignee: VLSI Technology, Inc., San Jose, Calif.

[21] Appl. No.: 171,590

[22] Filed: Dec. 22, 1993

[51] Int. Cl.⁶ .................. H01L 21/70; H01L 27/00
[52] U.S. Cl. .................. 437/60; 437/922; 437/947; 148/DIG. 55
[58] Field of Search ........... 437/947, 60, 922, 52; 148/DIG. 55

[56] References Cited

U.S. PATENT DOCUMENTS

| | | | |
|---|---|---|---|
| 4,857,141 | 8/1989 | Abe | 156/644 |
| 4,889,588 | 12/1989 | Fior | 156/643 |
| 4,978,420 | 12/1990 | Bach | 156/643 |
| 5,057,186 | 10/1991 | Chen et al. | 156/643 |
| 5,208,170 | 5/1993 | Kobeda et al. | 437/34 |
| 5,219,791 | 6/1993 | Freiberger | 437/195 |
| 5,290,734 | 3/1994 | Boardman et al. | 437/195 |

*Primary Examiner*—George Fourson
*Assistant Examiner*—H. Jey Tsai
*Attorney, Agent, or Firm*—Patrick T. King

[57] ABSTRACT

An improved method for forming vias in an anti-fuse semiconductor device through an oxide layer to an underlying metallic layer. A wet etch is performed on the oxide layer at selected regions where vias are to be formed. The wet etch is controlled such that a first recessed area is formed in the oxide layer at the selected regions. The first recessed area formed by the wet etch extends only partially through the oxide layer towards the underlying metallic layer. Additionally, the first recessed area is formed having a smoothly shaped contour. Next, a dry etch is performed on the oxide layer at the selected regions where the vias are to be formed. The dry etch is performed within the first recessed area. The second recessed area has a smaller cross sectional area than the first recessed area such that the second recessed area is peripherally bordered by the first recessed area. The second recessed area extends from the bottom of the first recessed area completely through the remaining oxide layer to the underlying metallic layer. In so doing, when amorphous silicon is deposited into the vias, cusping of the amorphous silicon within the vias is substantially reduced. As a result, the step of depositing a spacer oxide to fill in notches created by cusping of the amorphous silicon layer is eliminated. Consequently, when the amorphous silicon is removed or etched from selected strap vias, because no spacer oxide has been deposited, no deleterious residue or "dog ears" of amorphous silicon remain within the strap vias.

11 Claims, 4 Drawing Sheets

WET/DRY ANTI-FUSE VIA ETCH

BACKGROUND OF THE INVENTION

1. Field of the Invention

This invention relates to semiconductor processing techniques. Specifically, the present invention relates to an improved anti-fuse semiconductor device via formation method.

2. Prior Art

In order to form anti-fuse semiconductor devices, several processing steps are performed. First, well known CMOS processing steps are performed up to the deposition of an inter-metal oxide over a first metal or "metal 1" layer. Next, a second metallic layer is deposited and etched as desired over the inter-metal oxide layer to form a conductive layer or "straps." An oxide layer is then deposited over the straps. After the deposition of the oxide layer, vias are formed extending completely through the oxide layer to the underlying straps.

A layer of amorphous silicon is then deposited over the oxide layer and into the vias formed therethrough. However, in prior art anti-fuse semiconductor device processing methods, notching or "cusping" of the amorphous silicon layer occurs within the vias. That is, as the amorphous silicon is deposited into the vias, the thickness of amorphous silicon is much greater at the center of the vias than at the corners of the vias. As a result, unwanted cusps or crevices in the layer of amorphous silicon are produced in the corner regions of the vias.

The production of cusps in the layer of amorphous silicon deposited into the vias is deleterious to the integrity of anti-fuse semiconductor devices. Specifically, the breakdown or programming voltage of the anti-fuse devices is dependent upon, among other things, the thickness of the layer of amorphous silicon within the "fuse" vias. That is, during a subsequent processing step, a third metallic layer is deposited over the layer of amorphous silicon. The cusps allow the metallic layer to closely approach the underlying straps. Thus, when voltage is applied to the devices, a much lower breakdown or programming voltage than is desired causes the anti-fuse device to become conductive.

In an attempt to prevent the third metallic layer from descending into the cusps in the amorphous silicon layer at the corner of the fuse vias, prior art anti-fuse semiconductor device formation techniques employ additional processing steps. In the prior art, after the deposition of the layer of amorphous silicon, but before the deposition of the third metallic layer, an additional oxide or "spacer oxide" layer is deposited over the amorphous silicon and into the vias. The spacer oxide fills the cusps present in the amorphous silicon at the corners of the vias. The spacer oxide is then removed or etched from everywhere except the cusps in the amorphous silicon at the corner of the fuse vias. In so doing, when the third metallic layer is subsequently deposited over the amorphous silicon and into the fuse vias, the spacer oxide present in the cusps prevents the metal from filling the cusps.

However, in addition to the increased cost and decreased cycle time associated with the deposition and etching steps of the spacer oxide, other problems are also created by the spacer oxide steps. For example, in certain vias such as strap vias, which formed in close proximity to and at the same time as the fuse vias, the layer of amorphous silicon is completely removed therefrom. Thus, when the third metallic layer is deposited, direct contact is made between the third metallic layer deposited into the strap vias and the underlying straps. Unfortunately, the spacer oxide step used to fill the amorphous silicon cusps of the fuse vias can also reduce or even prevent contact between the third metallic layer and the underlying straps in neighboring strap vias. That is, in the prior art the amorphous silicon is etched from the unwanted areas including the strap vias using an etch having high amorphous silicon selectivity. As a result, other material such as the oxide used for the spacer oxide will not be removed or etched by the amorphous silicon etch. Rather, the spacer oxide will act as a barrier and prevent etching of the underlying amorphous silicon in the cusp areas of the strap vias. Thus, unwanted amorphous silicon residue or "dog ears" remain in the strap vias after the amorphous silicon etch step. Consequently, when the third metallic layer is deposited into the strap vias, the dog ears prevent the metallic layer from reaching and forming electrical connections to the underlying straps.

Therefore, prior art anti-fuse semiconductor device formation methods employ numerous steps resulting in increased cost and decreased cycle time in an attempt to deal with the problem of cusping of the amorphous silicon layer within the corners of the fuse vias. Furthermore, the prior art steps also generate unwanted residual amorphous silicon within the link or strap vias. As a result, electrical connections within the strap vias between the third metallic layer and the underlying straps are obstructed.

Thus, the need has arisen for an anti-fuse semiconductor device via, and a method for forming such a via, which allows for the deposition of a uniform layer of amorphous silicon without cusping of the amorphous silicon layer within the via, which reduces the amount of required process steps, does not require the deposition of a spacer oxide, and which does not produce substantial amorphous silicon residue in strap vias.

SUMMARY OF THE INVENTION

It is therefore an object of the present invention to provide an improved anti-fuse via etch formation process which provides for a more uniform deposition of an amorphous silicon layer thereby preventing cusping in fuse vias, eliminates the need for the deposition of a spacer oxide thereby reducing the required number of process steps, and which does not produce substantial amorphous silicon residue in strap vias. The above object has been achieved by a fuse via formed using a combination wet/dry etch to provide a fuse via contoured to allow for uniform deposition of a layer of amorphous silicon and which eliminates cusping of the amorphous silicon layer within the time via.

In the present invention, in order to form anti-fuse semiconductor devices, CMOS processing steps up to and including the deposition of an inter-metal oxide layer over a first metallic layer are performed. Next, a second metallic layer or strap is formed over the over the inter-metal oxide layer. An oxide layer is then deposited over the strap. An etch such as, for example, a wet etch or an isotropic dry etch is performed on the oxide layer at selected regions where vias are to be formed. The wet etch is controlled such that a first recessed area is formed in the oxide layer at the selected regions. The first recessed area formed by the wet or isotropic dry etch extends only partially through the oxide layer towards the underlying metallic layer. Additionally, the first recessed area is formed having a smoothly shaped contour. Next, a dry etch is performed on the oxide layer at the selected regions where the vias are to be formed. The dry etch is performed within the first recessed area. The second recessed area has a smaller cross sectional area than the first recessed area such that the second recessed area is peripherally bordered by the first recessed area. The second recessed area extends from the bottom of the first recessed area completely through the remaining oxide layer to the underlying metallic layer. In so doing, when amorphous silicon is deposited into the vias, cusping of the amorphous silicon within the vias is substantially reduced. As a result, the step of depositing a link spacer oxide to fill in notches created by cusping of the amorphous silicon layer is eliminated. Consequently, when the amorphous silicon is removed or etched from selected strap vias, because no link spacer oxide has been deposited, no deleterious residue or "dog ears" of amorphous silicon remain within the strap vias.

Therefore, the present invention provides an anti-fuse semiconductor device via, and a method for forming such a via, which allows for the deposition of a uniform layer of amorphous silicon without cusping of the amorphous silicon layer within the via, which reduces the amount of required process steps, does not require the deposition of a spacer oxide, and which does not produce substantial amorphous silicon residue in strap vias.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1A:
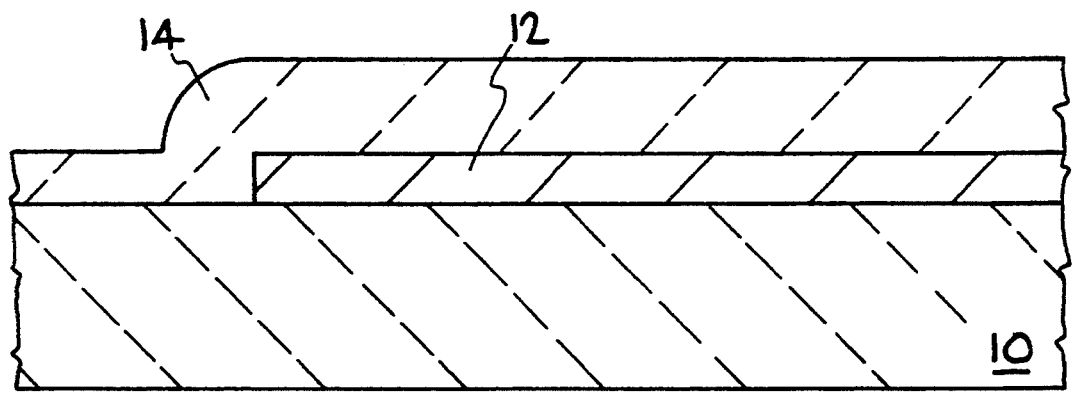
FIGS. 1A-1F are side sectional views of the Prior Art steps used in the formation of the anti-fuse semiconductor device.

With reference now to Prior Art FIG. 1A, a starting step in the formation of a prior art anti-fuse semiconductor device is shown. Standard CMOS processing steps are performed on a substrate 10 up to and including the deposition of and inter-metal oxide layer 14 over a first metallic or "metal 1" layer 12.

Figure 1B:
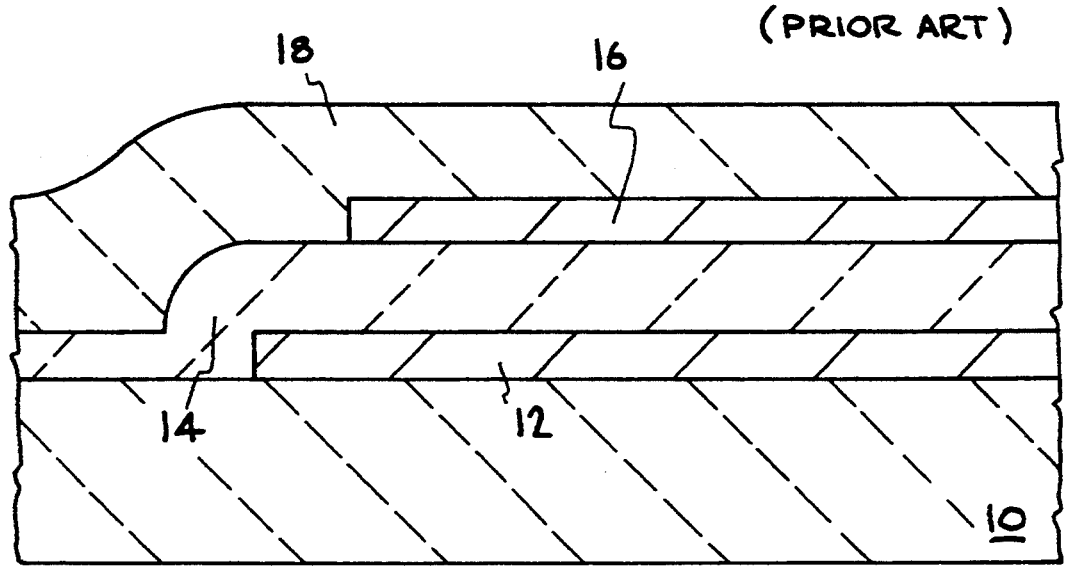

Referring now to Prior Art FIG. 1B, additional steps in the formation of a prior art anti-fuse semiconductor device are shown. After the deposition of a second metallic layer 16 over inter-metal oxide layer 14, an oxide layer 18 is deposited over the second metallic layer.

Figure 1C:
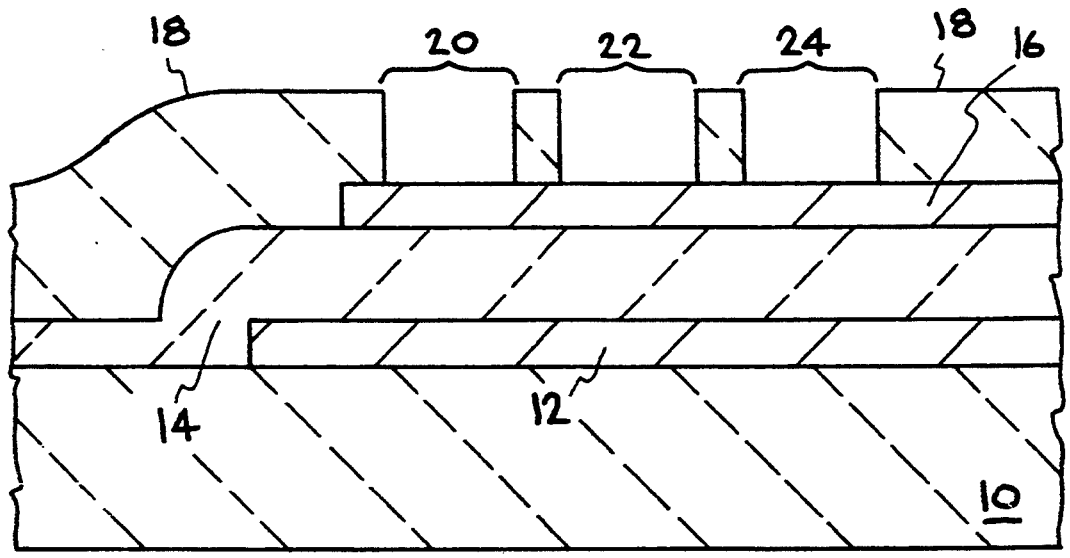

Referring next to Prior Art FIG. 1C, vias 20, 22, and 24, for example, are formed through oxide layer 18 extending completely to second metal layer 16. As indicated in FIG. 1C, in the prior art, vias 20, 22, and 24 extend vertically downward such that the entire sidewalls of vias 20, 22, and 24 are oriented perpendicular to metallic layer 16. In the prior art, vias 20, 22, and 24 are formed using a plasma etch.

Figure 1D:
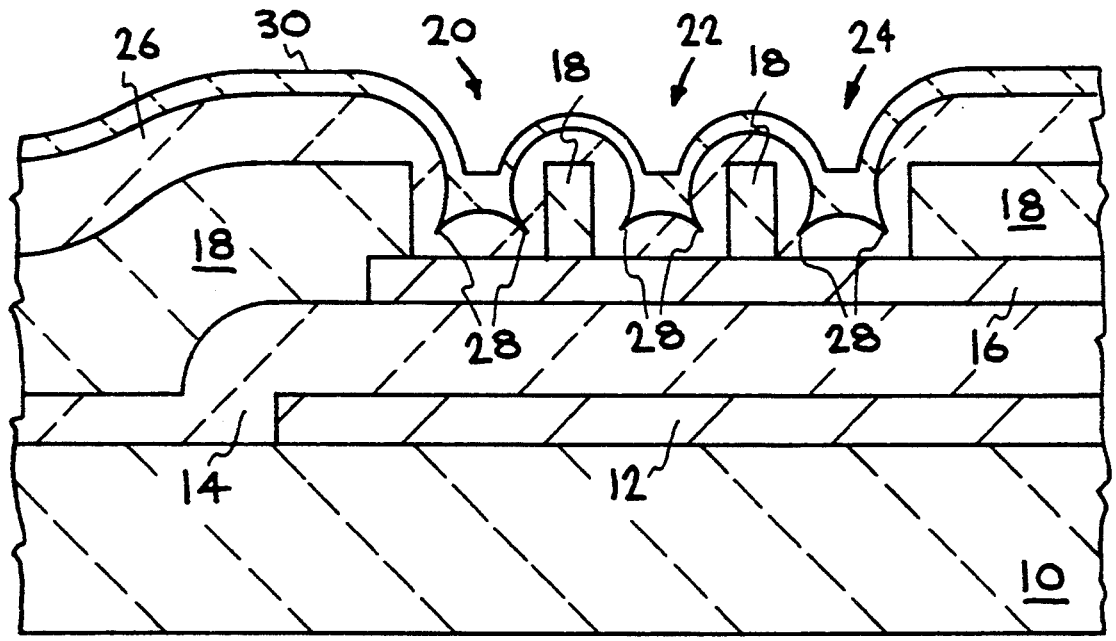

With reference next to Prior Art FIG. 1D, a layer of amorphous silicon 26 is then deposited over oxide layer 18 and into vias 20, 22, and 24. However, in prior art anti-fuse semiconductor device processing methods, notching or "cusping" of the amorphous silicon layer occurs within the vias. As shown in FIG. 1D, due to poor step coverage of amorphous silicon layer 26, as amorphous silicon layer 26 is deposited into vias 20, 22, and 24, the thickness of amorphous silicon layer 26 is much greater at the center of vias 20, 22, and 24 than at the corners of vias 20, 22, and 24. As a result, unwanted crevices or cusps 28 in amorphous silicon layer 26 are produced in the corner regions of vias 20, 22, and 24.

With reference still to FIG. 1D, cusps 28 in amorphous silicon layer 26 within vias 20, 22, and 24 are deleterious to the integrity of anti-fuse semiconductor devices. Specifically, in anti-fuse semiconductor devices, the breakdown or programming voltage of the device is dependent upon, among other things, the thickness of the amorphous silicon layer within the vias. That is, during a subsequent processing step, when a third metallic layer is deposited over the layer of amorphous silicon. Cusps 26 allow the metallic layer to closely approach underlying metallic layer 16. Thus, when voltage is applied to the devices, a much lower breakdown or programming voltage than is desired causes the anti-fuse device to become conductive.

Referring still to FIG. 1D, in an attempt to "fill-in" cusps 28 in amorphous silicon layer 26 at the corner of vias 20, 22, and 24 and prevent the third metallic layer from descending into cusps 28, prior art anti-fuse semiconductor device formation techniques employ additional processing steps. As shown in FIG. 1D, after the deposition of amorphous silicon layer 26, but before the deposition of the third metallic layer, an additional oxide or "spacer oxide" layer 30 is deposited over amorphous silicon layer 26 and into vias 20, 22, and 24. Spacer oxide layer 30 fills cusps 28 present in amorphous silicon layer 26 at the corners of vias 20, 22, and 24.

Figure 1E:
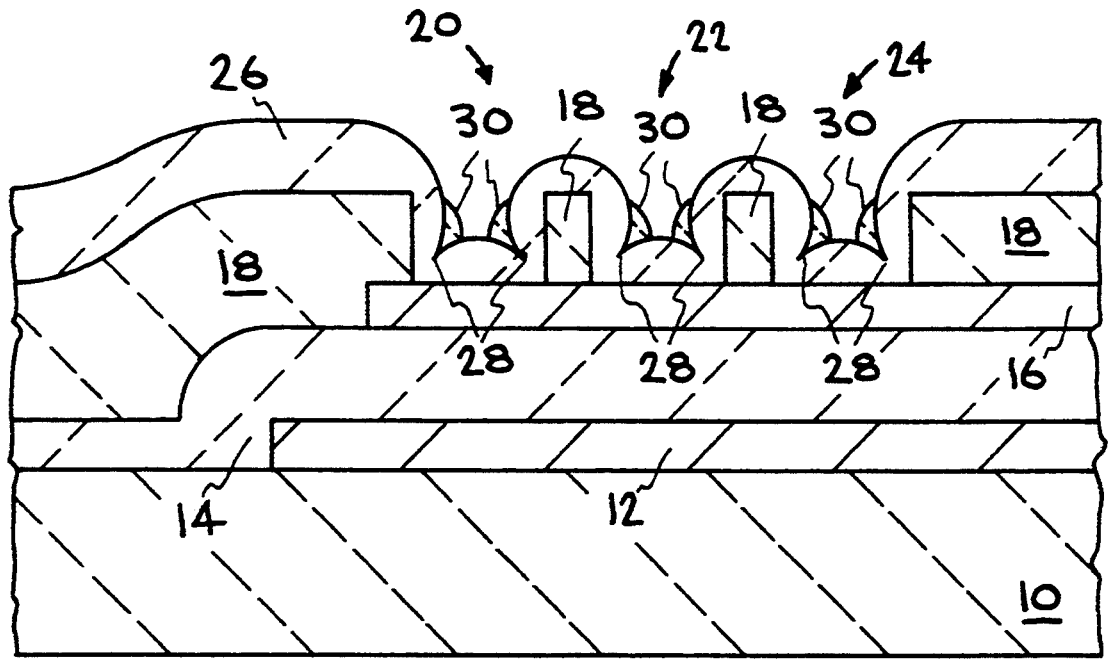

With reference next to Prior Art FIG. 1E, spacer oxide layer 30 is then removed or etched from everywhere except cusps 28 in amorphous silicon layer 26 at the corner of vias 20, 22, and 24.

Figure 1F:
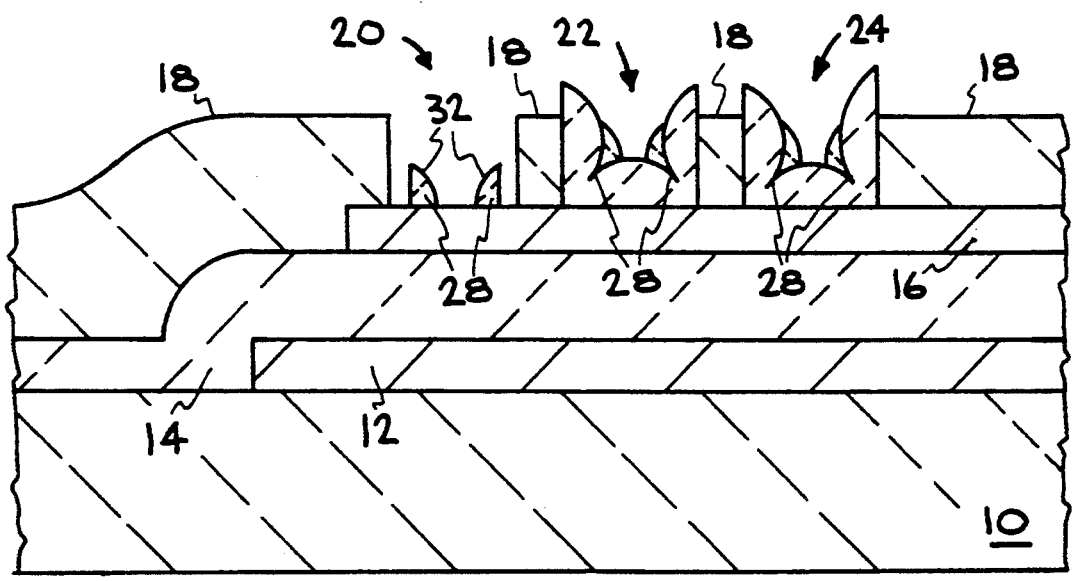

Referring now to Prior Art FIG. 1F, amorphous silicon layer 26 is removed from all areas except for "fuse" vias 22 and 24 of anti-fuse semiconductor devices using an etch having high amorphous silicon selectivity. However, in certain vias such as "strap" via 20, which was formed in close proximity to and at the same time as fuse vias 22 and 24, amorphous silicon layer 26 is completely removed therefrom. Thus, when the third metallic layer, not shown, is deposited it is intended that direct contact be made between the third metallic layer deposited into strap via 20 and the underlying metallic layer 16. However, in the prior art as shown in FIG. 1F spacer oxide layer 30 used to fill amorphous silicon cusps 28 in fuse vias 22 and 24 prevents contact between the third metallic layer, not shown and underlying metallic layer 16. That is, in the prior art as amorphous silicon layer 26 is etched from strap via 20 using an etch having high amorphous silicon selectivity, spacer oxide layer 30 will not be removed or etched by the amorphous silicon etch. Rather, the spacer oxide layer 30 will act as a barrier and prevent etching of underlying amorphous silicon layer 26 in cusp areas 28 of strap via 20. Thus, unwanted amorphous silicon residue or "dog ears" 32 remain in strap via 20 after the amorphous silicon etch step. Consequently, when the third metallic layer is deposited into strap via 20, dog ears 32 prevent the metallic layer, not shown, from reaching and forming electrical connections to underlying metallic layer 16.

Figure 2A:
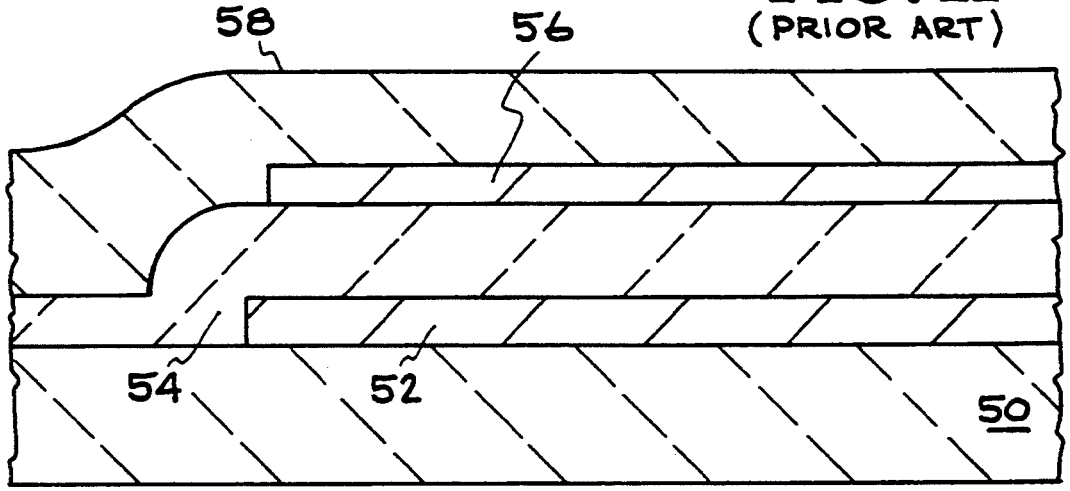
FIGS. 2A-2E are side sectional views of the steps used in the formation of anti-fuse semiconductor device vias in accordance with the present claimed invention.

With reference now to FIG. 2A a side view illustrating process steps used in the anti-fuse semiconductor device via formation method, in accordance with the present claimed invention, is shown. In the present claimed invention, a series of CMOS processing steps are performed on a substrate 50 such that a first metallic layer 52 has an inter-metal oxide layer 54 formed thereon. Next as shown in FIG. 2A, a second metallic layer 56 is then deposited over inter-metal oxide layer 54. In the present embodiment, second metallic layer 56 is formed of a titanium-tungsten (TiW) alloy and deposited to a thickness of approximately 2200 angstroms. Second metallic layer 56 is etched and removed from selected areas above substrate 50 to form TiW "straps." Although straps 56 are formed of TiW in the present embodiment, the present claimed invention is also well suited to the use of other electrically conductive materials well known in the art, and to the use of thicknesses other than set forth above. After the formation of TiW straps 56, a link oxide layer 58 is deposited thereon. Link oxide layer 58 is formed for example of a plasma deposited silicon oxide. The present claimed invention is, however, well suited to the use of numerous other oxides or protective layers well known in the semiconductor processing art, and to thicknesses varying from the specific thickness set forth above.

Figure 2B:
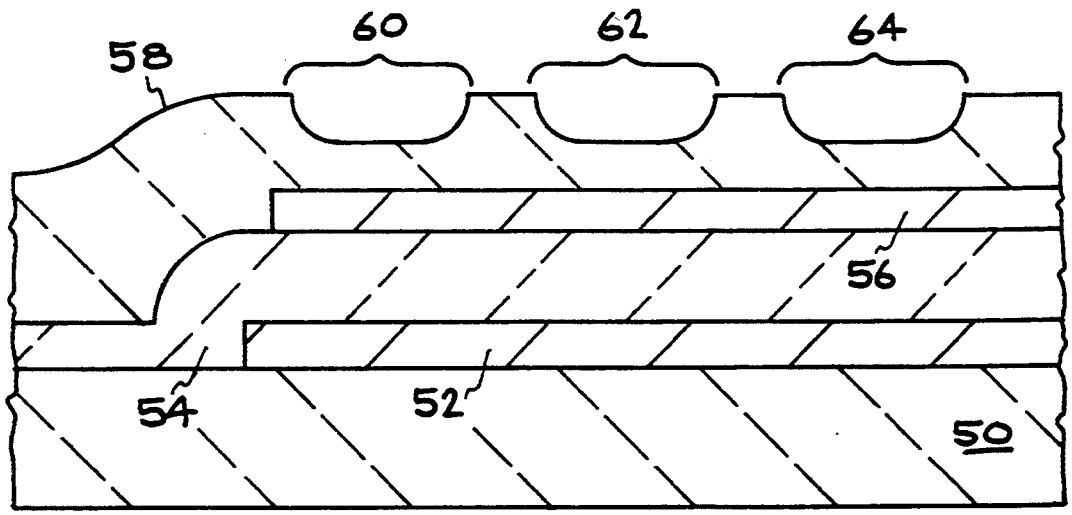

Referring next to FIG. 2B, another side view is shown illustrating the next process step used in the anti-fuse semiconductor device via formation method, in accordance with the present claimed invention. As shown in FIG. 2B a series of first recessions shown as recessions 60, 62, and 64 are formed at regions where vias are to be formed. First recessions 60, 62, and 64 are formed using a wet etch such as, for example, a HF etch. However, the methods of the present claimed invention are also well suited to the numerous other types of wet etching agents well known in the art. Furthermore, in alternate embodiments, an isotropic plasma etch may be used in place of a wet etch. Additionally, as shown in FIG. 2B, first recessions 60, 62, and 64 extend only partially through link oxide layer 58 towards TiW straps 56. That is, in the present embodiment of the claimed invention the wet etch used to formed first recessions 60, 62, and 64 is time dependent such that only a portion of link oxide layer is removed in recessions 60, 62, and 64. In the present embodiment, first recessions 60, 62, and 64 are formed extending approximately halfway through link oxide layer 58.

With reference still to FIG. 2B, unlike the prior art vias, first recessions 60, 62, and 64 of link oxide layer 58 have a rounded or smooth contour. That is, the sidewalls of first recessions 60, 62, and 64 do not extend only downward in a vertical direction perpendicular to straps 56, but, rather, the sidewalls of first recessions 60, 62, and 64 also extend in a horizontal direction through link oxide layer 58. Thus, rounded or smoothly contoured recessions 60, 62, and 64 are formed through link oxide layer 58.

Figure 2C:
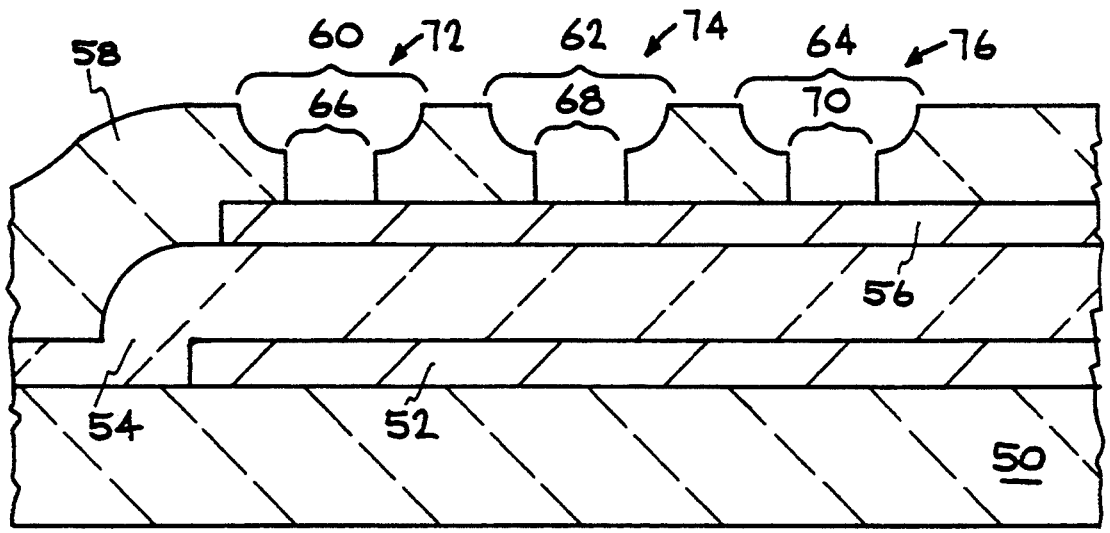

With reference now to FIG. 2C, another side view is shown illustrating the next process step used in the anti-fuse semiconductor device via formation method, in accordance with the present claimed invention. As shown in FIG. 2C, a second series of recessions shown as recessions 66, 68, and 70 are formed within first recessions 60, 62, and 64. Second recessions 66, 68, and 70 have a smaller cross-sectional area than first recessions 60, 62, and 64, and are formed within first recessions 66, 68, and 70 such that first recessions 60, 62, and 64 peripherally border second recessions 66, 68 and 70.

With reference still to FIG. 2C, second recessions 66, 68, and 70 are formed using a dry etch. In the present embodiment, a plasma etch is used to form recessions 66, 68, and 70, however, the methods of the present claimed invention are also well suited to any of the numerous other dry etching techniques well known in the art. As shown in FIG. 2C second recessions 66, 68, and 70 extend from the bottom of first recessions 60, 62, and 64 to straps 56. In so doing, a pathway or via is formed which extends downward completely through link oxide layer 58 to straps 56. Thus, the present claimed invention forms vias 72, 74, and 76 using a combination wet/dry etch, or isotropic/anisotropic dry etch.

Figure 2D:
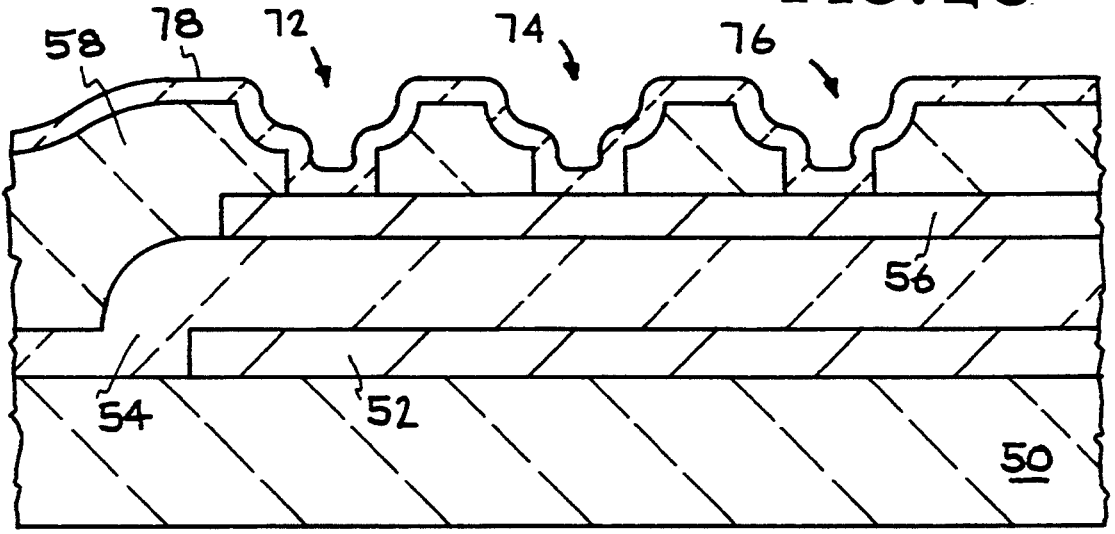

Referring next to FIG. 2D, a layer of amorphous silicon 78 is then deposited over link oxide layer 58 and into vias 72, 74, and 76. In the present embodiment layer 78 of amorphous silicon is deposited to a thickness of approximately 1650 angstroms. Although such a thickness is used in the present embodiment, the present claimed invention is also well suited other thicknesses as well. In the present invention, unlike the prior art, cusps are not produced in amorphous silicon layer 78 at the corner regions of vias 72, 74, and 78 where the sidewalls of recessions 66, 68, and 70 contact straps 56. By forming vias 72, 74, and 76 using first and second recessions, the shape of vias 72, 74, and 78 is such that a more uniform layer 78 of amorphous silicon may be deposited therein. As such, thinning or cusping of amorphous silicon layer 78 at the corner regions of vias 72, 74, and 78 is eliminated.

Referring still to FIG. 2D, several substantial benefits are realized by the elimination of cusping in amorphous silicon layer 78, as set forth in the present claimed invention. Because no cusps are present in amorphous silicon layer 78 at the corner regions of vias 72, 74, and 76, the need for the deposition of a spacer oxide, as found in the prior art, is eliminated. Consequently, no etching of any spacer oxide layer is required in the present claimed invention. By eliminating the deposition and etching of the spacer oxide layer the cost and the cycle time of the anti-fuse semiconductor device formation process is reduced. Furthermore, potentially harmful wafer handling required with additional process steps is also reduced. Thus, by eliminating cusping of amorphous silicon layer 78, the present claimed invention, reduces the cost and cycle time associated with the formation of an anti-fuse semiconductor devices, while simultaneously increasing the yield of such formation processes.

With reference still to FIG. 2D, as a further benefit of the present claimed invention, by eliminating cusps in amorphous silicon layer 78 at the corner regions of vias 72, 74, and 76, the breakdown or programming voltage of the anti-fuse semiconductor device can be precisely controlled. As stated above, in anti-fuse semiconductor devices, the breakdown or programming voltage of the device is dependent upon, among other things, the thickness of the amorphous silicon layer within the vias. In the prior art, cusps in the amorphous silicon layer at the corner regions of vias allow a subsequently deposited metallic layer to penetrate through the amorphous silicon layer and closely approach underlying metallic layer. Thus, when voltage is applied to the devices, a much lower breakdown or programming voltage than is desired causes the anti-fuse device to become conductive. However, in the present claimed invention, uniform amorphous silicon layer 78 does not allow such unwanted penetration of the subsequently deposited metal layer. Thus, the breakdown or programming voltage of the anti-fuse semiconductor device is not compromised.

Figure 2E:
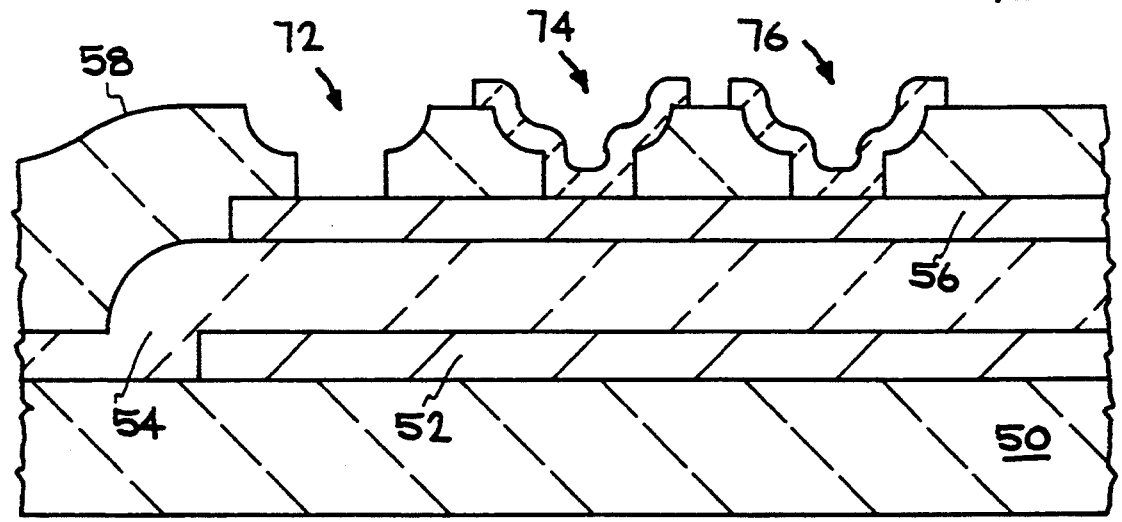

Referring now to FIG. 2E, amorphous silicon layer 78 is removed from all areas except for "fuse" vias 74 and 76 of anti-fuse semiconductor devices using an etch having high amorphous silicon selectivity. However, unlike the prior art, because no spacer oxide is required in the present claimed invention, the amorphous silicon layer can be completely removed from strap via 72. That is, because no spacer oxide is required in the present claimed invention, no remnants of spacer oxide obstruct the etching of the amorphous silicon layer within strap via 72. Therefore, no unwanted amorphous silicon residue or "dog ears" remain in strap via 72 after the amorphous silicon etch step. Consequently, when the third metallic layer, not shown, is deposited into strap via 72, complete electrical connections will be made between the deposited metallic layer and straps 56.

With reference again to FIG. 2E, the present invention also eliminates over etching during the amorphous silicon etch step. In so doing, unwanted etching of straps 56 is prevented. That is, in the prior art, due to the cusping of the amorphous silicon layer, during the etching of the amorphous silicon layer the amorphous silicon present in the corner regions of the vias is removed or etched before all of the amorphous silicon is removed from the center region of the vias. As a result, the portion of the straps which is exposed in the corner regions of the vias may be etched while the remaining amorphous silicon present in the centers of the vias is etched. Thus, because a more uniform layer of amorphous silicon is deposited into vias 72, 74, and 76 in the present claimed invention, unwanted etching of underlying straps is eliminated.

The anti-fuse semiconductor devices of the present claimed invention are completed using standard antifuse semiconductor device formation processes. These formation processes include the deposition of a metal layer over the amorphous silicon layer, followed by the deposition of protective semiconductor coatings.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. An improved anti-fuse semiconductor device formation method comprising the steps of:

forming an inter-metal oxide layer over a first metallic layer disposed on a semiconductor substrate, depositing a second metallic layer over said inter-metal oxide layer, depositing an oxide layer over said second metallic layer, forming vias extending completely through said oxide layer to said second metallic layer by;

performing a first etch on portions of said oxide layer where said vias are to be formed, said first etch partially removing said oxide layer from said portions such that a first recessed area is formed extending only partially through said oxide layer, performing a second etch on said portions of said oxide layer where said vias are to be formed, said second etch removing said oxide layer and forming a second recessed area extending completely through said oxide layer such that said second metallic layer is exposed in the bottom of said second recessed area, said second recessed area formed within said first recessed area, said second recessed area further formed having a cross sectional area smaller than the cross sectional area of said first recessed area such that said first recessed area peripherally borders said second recessed area, depositing a layer of amorphous silicon over said oxide layer such that said amorphous silicon is deposited into said vias, removing said amorphous silicon from at least one of said vias, depositing a third metallic layer over said layer of amorphous silicon and into said at least one via from which said amorphous silicon has been removed, completing the formation of an anti-fuse semiconductor device by performing subsequent processing steps.

2. The improved anti-fuse semiconductor device formation method as recited in claim 1 wherein said first recessed area is formed having a smoothly shaped contour.

3. The improved anti-fuse semiconductor device formation method as recited in claim 1 wherein said first etch is performed using a wet etch.

4. The improved anti-fuse semiconductor device formation method as recited in claim 3 wherein said wet etch is performed using a HF etch.

5. The improved anti-fuse semiconductor device formation method as recited in claim 1 wherein said first etch is performed using an isotropic plasma etch.

6. The improved anti-fuse semiconductor device formation method as recited in claim 1 wherein said second etch is performed using a dry etch.

7. The improved anti-fuse semiconductor device formation method as recited in claim 1 wherein said first recessed area extends approximately halfway through said oxide layer.

8. The improved anti-fuse semiconductor device formation method as recited in claim 1, wherein said second recessed area extends completely through said oxide layer.

9. The improved anti-fuse semiconductor device formation method as recited in claim 1 wherein said amorphous silicon layer does not require the deposition of a spacer oxide layer thereon.

10. The improved anti-fuse semiconductor device formation method as recited in claim 1 wherein said amorphous silicon layer does not require the removal of a spacer oxide layer therefrom.

11. The improved anti-fuse semiconductor device formation method as recited in claim 1, wherein said amorphous silicon is removed from said at least one via such that no residual amorphous silicon obstructs the deposition of said third metallic layer into said at least one via.

* * * * *